United States Patent [19]

Morrison, Jr.

[11] Patent Number: 5,242,623
[45] Date of Patent: Sep. 7, 1993

[54] SCREEN-PRINTABLE THICK FILM PASTE COMPOSITION

[75] Inventor: William H. Morrison, Jr., Wilmington, Del.

[73] Assignee: E. I. Du Pont de Nemours and Company, Wilmington, Del.

[21] Appl. No.: 744,441

[22] Filed: Aug. 13, 1991

[51] Int. Cl.⁵ .................... H01B 1/00; H01B 1/20; H01B 1/22
[52] U.S. Cl. .................... 252/512; 752/513; 752/514; 752/518; 106/1.13; 106/1.15; 106/1.18; 106/1.21
[58] Field of Search ........... 252/513, 514, 518, 512; 106/1.13, 1.14, 1.15, 1.18, 1.19, 1.21

[56] References Cited

U.S. PATENT DOCUMENTS

| | | | |
|---|---|---|---|
| 3,924,221 | 12/1975 | Winkler | 252/518 |
| 4,493,789 | 1/1985 | Ueyama et al. | 252/514 |
| 4,496,475 | 1/1985 | Abrams | 252/518 |
| 4,548,741 | 10/1985 | Hormadaly | 252/518 |
| 4,576,735 | 3/1986 | Kuroki et al. | 252/512 |
| 4,654,166 | 3/1987 | Hormadaly | 252/518 |
| 4,793,946 | 12/1988 | Hsu | 106/1.13 |
| 4,830,988 | 5/1989 | Hang et al. | 106/1.13 |
| 4,859,364 | 8/1989 | Yamamoto et al. | 252/518 |
| 4,880,567 | 11/1989 | Prabhu et al. | 252/518 |
| 4,906,406 | 3/1990 | Hormadaly | 252/518 |
| 4,937,016 | 6/1990 | Suehiro et al. | 252/518 |
| 4,961,999 | 10/1990 | Hormadaly | 252/518 |
| 5,089,172 | 2/1992 | Allison et al. | 252/518 |
| 5,096,619 | 3/1992 | Slack | 252/518 |
| 5,122,302 | 6/1992 | Hormadaly | 252/518 |

FOREIGN PATENT DOCUMENTS

0146120A2 12/1984 European Pat. Off. .
0425073A1 2/1991 European Pat. Off. .

*Primary Examiner*—Paul Lieberman
*Assistant Examiner*—M. Kopec

[57] ABSTRACT

A screen printable thick film paste composition comprising finely divided particles of electrically functional solids dispersed in an organic medium comprising a plurality of solid organic polymers having high and low relaxation rate constants ($k_r$) dissolved in volatilizable organic solvent.

14 Claims, No Drawings

SCREEN-PRINTABLE THICK FILM PASTE COMPOSITION

FIELD OF INVENTION

The invention is directed to screen-printable thick film paste compositions and particularly to such compositions which have a reduced tendency to form cracks upon firing.

BACKGROUND OF THE INVENTION

One of the preferred methods for making electronic microcircuits is with thick film technology. Thick film circuits are made by alternatively applying layers of conductor and dielectric to a substrate which is usually alumina. The layers of conductor are connected to each other through small holes in the dielectric filled with conductor. These holes are called vias. The layers are made by printing a thick film paste on a screen printer, drying the layer at low temperature (<200° C.) to remove volatile solvents and then firing the layer at high temperature (>600° C.) to remove all other noninorganic components and densify the inorganic components. Frequently several layers are printed and dried, then fired together. This is called cofiring.

Thick film pastes are dispersions of inorganic solids in a liquid vehicle phase. This vehicle phase contains predominantly polymers, solvents and other miscellaneous additives. The inorganic solids can be conductive (e.g., gold, silver, copper) or dielectric (e.g., glass, refractory oxides). The polymer in a thick film paste serves at least the following functions: imparts proper printing rheology; provides good adhesion of the dried print to the substrate (alumina or thick film dielectric) before firing and gives enough strength to the unfired composite so it will not crack or chip during handling prior to firing.

New electronic circuits are being designed with finer features so more functionality can be placed in smaller spaces and/or higher circuit transmission speeds can be attained. Circuit makers have also required faster printing speeds to produce circuits at lower cost and in higher volumes. To manufacture these new circuits using thick film technology, dielectric pastes have to print smaller vias (openings between conductor layers) and conductor pastes will have to print finer lines. New generations of thick film paste products need to print with this higher resolution, but also at faster print speeds to meet these market needs. The vehicle (polymer, solvents, other organic additives) controls these printing parameters to a very large extent.

The polymer most commonly used in thick film pastes is ethyl cellulose. The ability to modify printing is restricted if ethyl cellulose is used because the printing is controlled to a great extent by the rheological properties imparted by the polymer to the paste. Most pastes are shear thinning (decreasing viscosity with increasing shear). The rate of recovery of the paste viscosity after the shear induced by the printing process is limited to a narrow range for pastes containing ethyl cellulose. To get resolution of fine features with these pastes, the viscosity of the paste has to be maintained at a high level. Pastes with viscosity in this range can not be printed at high speeds because the viscosity does not get low enough fast enough for efficient transfer of paste through the screen. The paste also tends to be tacky, causing the screen to stick to the printed part, especially at high print speeds. If the viscosity recovery rate of the paste could be controlled independently of the equilibrium viscosity, then much greater latitude would be possible in formulating high resolution, fast printing pastes.

SUMMARY OF THE INVENTION

In one aspect, the invention is directed to a screen printable thick film paste composition comprising finely divided particles of electrically functional solids dispersed in an organic medium comprising a plurality of solid organic polymers having high and low relaxation rate constants ($k_r$) dissolved in a volatilizable organic solvent, the proportions of the high and low $k_r$ polymers being such that the $k_r$ of the total paste composition is 0.01–0.1.

In a second aspect, the invention is directed to a volatilizable organic medium for use as a dispersing medium for screen printable thick film pastes comprising 60–90% wt. low $k_r$ solid organic polymer and 40–10% wt. high $k_r$ solid organic polymer dissolved in volatizable organic solvent.

DETAILED DESCRIPTION OF THE INVENTION

A. Electrically Functional Materials

The invention can be used effectively in screen printable thick film pastes utilizing all types of finely divided electrically functional solids. That is, the solids component of the compositions of the invention can be conductive, resistive or dielectric materials. The electric functionality of the solids does not itself affect the ability of the invention to overcome problems associated with printability, shrinkage and cracking. Thus, the invention is applicable to thick film resistor pastes in which the resistive materials may be metal oxides conductive pastes in which the conductive material is a base or noble metal, and dielectric materials such as glasses, glass-ceramics and various oxides such as $BaTiO_3$ and the like. Suitable conductive metals include Pd, Ag, Au, Pt, Cu, Ni and mixtures and alloys thereof.

It will be recognized by those skilled in the thick film art that the precursors of such electrically functional materials may be used as well as the materials themselves. As used in this context, the term "precursor" refers to a material other than the electrically functional material which upon exposure to the firing conditions of the paste is converted to or otherwise changed with respect to electrical functionality. The particle size distribution of the electrically functional amterials is not itself critical with respect to the effectiveness of the invention. But, as a practical matter, it is preferred that the particle size of the solids be in the range of 0.1–10 microns and preferably 0.5–5 microns.

B. Organic Medium

1. In General: The main purpose of the organic medium is to serve as a vehicle for dispersion of the finely divided solids of the composition in such form that it can readily be applied to a ceramic or other substrate. Thus, the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wetability of the solids and the substrate, good drying rate, dried film strength sufficient to withstand rough handling and good firing properties. Satisfactory appearance of the fired composition is also important.

In view of all these criteria, a wide variety of inert liquids has been used as organic medium. The organic medium for most thick film compositions is typically a solution of resin in a solvent and, frequently, a solvent solution containing both resin and thixotropic agent. The solvent usually boils within the range of 130°–350° C.

By far, the most frequently used resin for this purpose has been ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate have also been used.

2. Resin Component: The resins for use in the compositions of the invention are a mixture of normally solid organic polymers which have high relaxation rate constants (i.e., fast viscosity relaxation rates) and low relaxation rate constants (i.e., slow viscosity relaxation rates). As used herein, the term "low relaxation rate constant" (low $k_r$) refers to $k_r$ values of 0.01 and below, and the term "high relaxation rate constant" (high $k_r$) refers to $k_r$ values of 0.1 and above. The high and low $k_r$ polymers are used in proportions such that the relaxation rate constant for the paste containing the polymers is 0.01–0.1 and preferably 0.025–0.05. Paste $k_r$ values of 0.025 are considered optimum for most pastes which are screen printed rapidly, while $k_r$ values of 0.04 are considered optimum for most pastes which are used in very high resolution applications.

Though any soluble normally solid organic polymer having a suitably low $k_r$ can be used as the low $k_r$ component, it has been found that the most readily available polymers having such low $k_r$ values are the polysaccharides such as sugars, starches and cellulosic polymers. Of these, the cellulosic polymers are preferred. These include such materials as ethyl cellulose, cellulose nitrate, hydroxyethyl cellulose, ethylhydroxyethyl cellulose, carboxymethyl cellulose, hydroxypropyl cellulose and mixtures and derivatives thereof.

Virtually all synthetic polymers, on the other hand, have $k_r$ values which are considerably above 0.1, some of which are so high they cannot be measured by the below described procedure. It is, however, desirable to use such polymers in the invention since they can be used in minor amounts. The low $k_r$ polymers will ordinarily constitute 60–90% wt. of the polymer component of the organic medium and the high $k_r$ polymers 40–10% wt. It is preferred that the high $k_r$ polymers constitute no more than about 25% wt. of the polymer component of the organic medium. Suitable high $k_r$ polymers include polyacrylates (including polymethacrylates), polyesters, polylactones, poly(alkylene carbonates), phenoxy resins, poly(isobutylene), poly(alphamethyl styrene), poly(vinyl alcohol), poly(vinyl butyral), polyamides, polyethers, poly(phenylene oxide), poly(vinyl acetate) and the like. Of these, acrylic polymers and copolymers are preferred because of their superior burnout properties and their availability with suitable physical properties at reasonable cost.

3. Other Medium Components: The most widely used solvents for thick film applications are terpenes such as alpha-or beta-terpineol or mixtures thereof with other solvents such as kerosene, dibutylphthalate, butyl Carbitol, dibutyl Carbitol, Carbitol acetate, butyl Carbitol acetate, hexylene glycol and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic medium to solids in the dispersions can vary considerably and depends upon the manner in which the dispersion is to be applied and the kind of organic medium used. Normally, to achieve good coverage, the dispersions will contain complementarily by weight 60–90% solids and 40–10% organic medium. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (sec$^{-1}$) | Viscosity (Pa.s) | |
|---|---|---|
| 0.2 | 100–5000 | — |
| | 300–2000 | Preferred |
| | 600–1500 | Most Preferred |
| 4 | 40–400 | — |
| | 100–250 | Preferred |
| | 140–200 | Most Preferred |
| 384 | 7–40 | — |
| | 10–25 | Preferred |
| | 12–18 | Most Preferred |

The amount of organic medium (vehicle) utilized is determined mainly by the final desired formulation viscosity and print thickness.

Description of Tests

A. Viscosity Relaxation Test: The viscosity relaxation test was run on a Rheometrics Fluid Spectrometer model 8400. A 25 mm radius parallel plate fixture was used. The paste was subjected to 10 sec$^{-1}$ shear for 5 seconds, then the shear was dropped to 0.1 sec$^{-1}$ and the stress measured for up to 300 seconds. A pseudo first order kinetic expression $$B = B_i(1 - e^{k_r t})$$

where

B = observed stress at time t
$B_i$ = equilibrium stress at time infinity in dynes/cm$^2$
$k_r$ = relaxation rate constant in sec$^{-1}$.

was used to fit the data and determine the two parameters k and $B_i$.

B. Printing Tests: A 4.5 cm by 4.5 cm square of dielectric thick film paste was printed at about 20 μm fired thickness. The pattern contained about 260 400 μm vias, 200 225 μm vias, and 240 125 μm vias. Image analysis and optical microscopy was used to measure the area and size of the vias. Some of the parts were then fired at 850° C. in a belt furnace, and the size of the 400 μm vias was remeasured. The sizes before and after firing were compared.

A 4.5 cm by 4.5 cm square of dielectric thick film paste was printed at about 20 μm fired thickness. The pattern was a solid square. The squeegee speed was increased in about 1 cm/sec steps, and visual observations were made as to whether the part was sticking to the screen, or paste was being pulled off the part.

An approximately 13.5 cm by 10 cm print of dielectric thick film paste was printed at about 20 μm fired thickness. A 5 cm by 5 cm area in the center of the dried but unfired part was examined for small pinholes ($\geq 25$ μm) on an optical microscope using backlighting at ~50×. These pinholes were counted.

A complex part of about 165 cm by 8 cm was printed with a variety of conductor lines and pads. Over selected areas dielectric was overprinted, and the part was cofired. Under an optical microscope at about 50× the parts were examined for the presence of cracks in the dielectric where it was over conductor. The parts were rated excellent, good, fair or poor, depending on how many cracks in the dielectric were observed and how large they were.

A test pattern containing 250 μm lines and spaces, 125 μm lines and spaces, and 125 μm lines and 250 μm spaces was used for the printing evaluation of the conductors. Lines both parallel and perpendicular to the print direction were on the pattern. An optical microscope was used to measure the width of the printed lines. Both dried and fired prints were measured. The test substrates were 5 cm by 5 cm.

EXAMPLES

EXAMPLES 1-3

A series of three dielectric thick film pastes was prepared and tested by the method described above to determine the effect of paste $k_r$ upon resolution of the dried via holes. The paste contained by weight % 71.4% glass, 4.2% metal oxide and 24.4% organic medium containing 8.3% polymer. These data, which are given in Table 1, show that as paste $k_r$ was raised from 0.026 to 0.094, the dried via hole resolution improved significantly from a via area of 27,300 to 36,100 sq. microns.

TABLE 1

| Example No. | 1 | 2 | 3 |
|---|---|---|---|
| EC/Acrylic Weight Ratio | 1.57 | 1.34 | 1.15 |
| $k_r$ (sec$^{-1}$) | 0.026 | 0.055 | 0.094 |
| Via Area (μm$^2$) Dried | 27300 | 35400 | 36100 |

EXAMPLES 4-6

A further series of dielectric thick film pastes was prepared in the above-described manner and tested with respect to both dried and fired via resolution. The paste had the same composition as the one used in Examples 1-3. These data, which are given in Table 2, show that the addition of high $k_r$ polymers significantly raised both the dried and fired via resolution of the pastes. The fired via resolution data show, however, that when the $k_r$ of the paste approaches 0.1, the benefit of improved via resolution becomes less and above that value, resolution may even be adversely affected.

TABLE 2

| Example No. | 4 | 5 | 6 |
|---|---|---|---|
| EC/Acrylic Weight Ratio | No Acrylic | 1.34 | 1.15 |
| $k_r$ (sec$^{-1}$) | 0.016 | 0.055 | 0.075 |
| Via Area (μm$^2$) Dried | 131900 | 149000 | 152000 |
| Via Area (μm$^2$) Fired | 96100 | 168100 | 160000 |

EXAMPLES 7-9

A further series of three dielectric pastes was formulated using a second dielectric composition to observe the effect of using high and low $k_r$ polymers on paste $k_r$ and the effect of paste $k_r$ on the resolution of the dried via holes. The paste contained 40.5% glass, 34.7% metal oxides and 24.8% organic medium containing 8.15% polymers. These data, which are given in Table 3, show resolution of the dried vias was improved even when the paste $k_r$ value reached 0.140.

TABLE 3

| Example No. | 7 | 8 | 9 |
|---|---|---|---|
| EC/Acrylic Weight Ratio | 1.34 | 1.26 | 1.93 |
| $k_r$ (sec$^{-1}$) | 0.045 | 0.074 | 0.140 |
| Via Area (μm$^2$) Dried | 16400 | 22300 | 29700 |

EXAMPLES 10-12

A series of three dielectric thick film pastes was prepared in the above-described manner and tested with respect to both dried and fired via resolution. The paste had the same composition as the one used in Examples 6-9. These data, which are given in Table 4, show that the addition of high $k_r$ polymers significantly improved the fired via resolution of the pastes, though little or no effect was observed with respect to the dried unfired paste. The data do show, however, that no substantial additional improvement in resolution is obtained when the $k_r$ value of the paste exceeds about 0.1.

TABLE 4

| Example No. | 10 | 11 | 12 |
|---|---|---|---|
| EC/Acrylic Weight Ratio | No Acrylic | 1.26 | 1.95 |
| $k_r$ (sec$^{-1}$) | 0.008 | 0.074 | 0.140 |
| Via Area (μm$^2$) Dried | 141000 | 142000 | 140600 |
| Via Area (μm$^2$) Fired | 144400 | 168100 | 168100 |

EXAMPLES 13-16

A series of dielectric thick film pastes was prepared in the above-described manner using the same dielectric as in Examples 9-12. The compositions had different $k_r$ values and were tested as to dried via area resolution and were observed with respect to the occurrence of pinholes, degree of cracking and maximum printing speed. These data are given in Table 5. Analysis of the data from these examples shows that the use of mixed high and low $k_r$ polymers in the organic medium substantially improved dried via hole resolution and printing speed and reduced the cracking tendencies of the fired paste layers. Also observed was a substantial initial reduction in the number of pinholes in the fired layers. However, this advantage lessened and disappeared as the $k_r$ of the paste neared about 0.04. Thus, it can be seen that in this particular formulation, the $k_r$ value of the paste was rather narrowly critical with respect to pinholing and print speed, but not as to the other properties. Maximum printing speed refers to the speed of the squeegee over the printing screen. Satisfactory printing is obtained so long as the squeegee releases easily from the screen without sticking or skips in the printed conductive pattern.

TABLE 5

| Example No. | 13 | 14 | 15 | 16 |
|---|---|---|---|---|
| EC/Acrylic Weight Ratio | No Acrylic | 2.23 | 1.31 | 1.31 |
| $k_r$ (sec$^{-1}$) | 0.013 | 0.027 | 0.038 | 0.047 |
| Via Area ($\mu m^2$) Dried | 46000 | 48000 | 51100 | 53200 |
| Number Pinholes in 25 cm$^2$ | 130 | 50 | 350 | 401 |
| Degree of Cracking | Poor | Excellent | Excellent | Excellent |
| Maximum Printing Speed c/sec | 5 | >13 | 7 | 5 |

EXAMPLES 17-21

A series of conductive thick film pastes was prepared in the manner described above and tested with respect to the resolution of the lines and spaces. The paste contained by weight 78.8% conductive metal, 5.0% metal oxides, 0.7% glass and 15.5% organic medium containing 11.4% polymer(s). The data from these compositions are presented in Table 6 and show that substantial improvements in line/space resolution are obtained even as the $k_r$ value of the paste reached about 0.1.

TABLE 6

| Example No. | 17 | 18 | 19 | 20 | 21 |
|---|---|---|---|---|---|
| EC/Acrylic Weight Ratio | No Acrylic | 1.43 | 1.24 | 1.04 | 0.88 |
| $k_r$ (sec$^{-1}$) | 0.021 | 0.064 | 0.063 | 0.067 | 0.093 |
| Line Space ($\mu m$) Dried | 216/63 | 126/150 | 165/122 | 177/122 | 185/94 |
| Line Space ($\mu m$) Fired | 193/80 | 130/125 | 129/122 | 144/123 | 138/108 |

In the foregoing examples, the acrylic polymer was Elvacite 2041, a polymethacrylate copolymer made by the Du Pont Company, Wilmington, DE. The solvent in each of the examples was a mixture of terpineol, Carbitol acetate and dibutyl phthalate. In the conductive paste examples, the screen openings were 125 microns.

I claim:

1. A screen printable thick film paste composition comprising finely divided particles of electrically functional solids dispersed in an organic medium comprising 45-90% wt. low relaxation rate constant ($k_r$) solid organic polymer which is a polysaccharide having a $k_r$ value not greater than 0.01 and 55-10% high relaxation rate constant ($k_r$) solid organic polymer which is an acrylic having a $k_r$ value of at least 0.1 dissolved in a volatilizable organic solvent, the proportions of the high and low ($k_r$) polymers being such that the ($k_r$) of the total paste composition is 0.01-0.1.

2. The composition of claim 1 in which the $k_r$ of the total paste composition is 0.02-0.05.

3. The composition of claim 1 in which the polysaccharide is a cellulosic polymer.

4. The composition of claim 3 in which the cellulosic polymer is selected from the group consisting of ethyl cellulose, hydroxyethyl cellulose, ethylhydroxyethyl cellulose, carboxy methyl cellulose, hydroxypropyl cellulose and mixtures thereof.

5. The composition of claim 1 in which the acrylic polymer is a homopolymer or copolymer of a $C_{2-4}$ methacrylate ester.

6. The composition of claim 1 in which the electrically functional solids are conductive metals.

7. The composition of claim 1 in which the electrically functional solids are resistive oxides.

8. The composition of either claim 6 or claim 9 in which finely divided particles of inorganic binder are admixed with the electrically functional solids.

9. The composition of claim 1 in which the electrically functional solids are dielectrics.

10. The organic medium of claim 1 comprising 65-80% wt. low $k_r$ solid organic polymer and 35-20% wt. high $k_r$ solid organic polymer.

11. The organic medium of claim 12 in which the volatilizable organic solvent is comprised of terpineol.

12. The organic medium of claim 11 in which the volatilizable organic solvent is comprised of terpineol, a diethylene glycol ether or ester derivative thereof, and a plasticizer for the polymers.

13. The organic medium of claim 12 in which diethylene glycol monoethyl ether is diethylene glycol monobutyl ether.

14. The organic medium of claim 1 in which the plasticizer is dibutyl phthalate.

* * * * *

UNITED STATES PATENT AND TRADEMARK OFFICE
CERTIFICATE OF CORRECTION

PATENT NO. : 5,242,623
DATED : September 7, 1993
INVENTOR(S) : William H. Morrison, Jr.

It is certified that error appears in the above-indentified patent and that said Letters Patent is hereby corrected as shown below:

Column 8, line 28, replace "9" with --7--.
         line 36, replace "12" with --1--.
         line 45, replace "1" with --12--.

Signed and Sealed this

Nineteenth Day of April, 1994

Attest:

BRUCE LEHMAN

Attesting Officer          Commissioner of Patents and Trademarks